United States Patent [19]

Jin et al.

[11] Patent Number: 5,532,538
[45] Date of Patent: Jul. 2, 1996

[54] SENSING AND SIGNAL PROCESSING DEVICES USING QUASI-SH (SHEAR HORIZONTAL) ACOUSTIC WAVES

[76] Inventors: Yu Jin, 1015 W. 31st St., Chicago, Ill. 60608; Shrinivas G. Joshi, 20340 Downing Ct., Brookfield, Wis. 53045

[21] Appl. No.: 331,182

[22] Filed: Oct. 28, 1994

[51] Int. Cl.$^6$ ................................................. H01L 41/08
[52] U.S. Cl. .................... 310/313 R; 310/313 A
[58] Field of Search .................... 310/313 A, 313 R, 310/313 D, 319, 338

[56] References Cited

U.S. PATENT DOCUMENTS

| | | | |
|---|---|---|---|
| 4,688,429 | 8/1987 | Holroyd | 73/602 |
| 4,954,997 | 9/1990 | Dieulesaint et al. | 367/13 |
| 5,051,645 | 9/1991 | Brace et al. | 310/313 D |
| 5,076,094 | 12/1991 | Frye et al. | 310/313 R |
| 5,117,146 | 5/1992 | Martin et al. | 310/313 R |
| 5,129,262 | 7/1992 | White et al. | 73/599 |
| 5,321,331 | 6/1994 | Baer et al. | 310/313 D |

FOREIGN PATENT DOCUMENTS

| | | | |
|---|---|---|---|
| 6132776 | 5/1994 | Japan | 310/313 A |

OTHER PUBLICATIONS

"Applications of Lithium Niobate Acoustic Plate Mode as Sensor for Conductive Liquids" by S. Liew et al. 1990 Ultrasonics Symposium.

"Detection of Nucleic Acid Hybridization with an Acoustic Plate Mode Microsensor", J. Andle et al. 1990 Ultrasonics Symposium.

"Design of An Improved Acoustic Plate Mode Delay Line for Biosensor Applications" by J. Andle, et al. 1992 Ultrasonics Symposium.

"An Acoustic Plate Mode Biosensor" by J. Andle et al., Sensors and Actuators, 1992.

"Electrical Surface Perturbation of a Piezoelectric Acoustic Plate Mode by a Conductive Liquid Loading" by Fosse et al., IEEE Transactions on Ultrasonics, Ferroelectrics and Frequency Control, Jul. 1992.

*Primary Examiner*—Thomas M. Dougherty
*Attorney, Agent, or Firm*—Andrus, Sceales, Starke & Sawall

[57] ABSTRACT

A new type of acoustic wave which is nearly polarized in the shear horizontal direction, and which can propagate in thin elastic plates if the ratio $h/\lambda$ is less than about 3 where h is the plate thickness and $\lambda$ is the acoustic wavelength. Attractive properties of this quasi-SH wave include: (i) nearly nondispersive propagation, (ii) very large value of $K^2$, the electromechanical coupling coefficient, and (iii) ability to propagate in contact with a liquid medium without suffering excessive attenuation. The nondispersive propagation and large value of $K^2$ makes the wave attractive for use in signal processing and sensing devices. Further, the fact that the wave can propagate in contact with a liquid medium allows the wave to be used in sensors that have to operate in contact with a liquid medium.

25 Claims, 6 Drawing Sheets

SENSING AND SIGNAL PROCESSING DEVICES USING QUASI-SH (SHEAR HORIZONTAL) ACOUSTIC WAVES

BACKGROUND AND SUMMARY OF THE INVENTION

The present invention relates to sensing and signal processing devices based on acoustic waves propagating in solids. More particularly, it has been discovered that a new type of acoustic wave, referred to as a quasi-SH (shear horizontal) acoustic wave, can propagate in thin elastic plates if the plate thickness is comparable in value to the acoustic wavelength. This wave has many attractive properties. Devices employing this wave will therefore provide many advantages over those using other types of acoustic waves.

Devices based on acoustic waves propagating in solids find many applications in electronics. The main applications of these devices are in the areas of signal processing and sensing. Signal processing devices include delay lines, resonators, filters, oscillators, convolvers, etc. Acoustic wave delay lines and resonators can also be used for a variety of physical, chemical, and biological sensing applications. Acoustic waves propagating in solids can be broadly classified into three types. These are (i) bulk acoustic waves, which are elastic waves propagating inside solids, (ii) surface acoustic waves, which are acoustic waves propagating at the free surface of a semi-infinite elastic medium, and (iii) Lamb waves or plate waves which are acoustic waves propagating in a plate of finite thickness.

The present invention is concerned with acoustic waves propagating in plates of finite thickness. In particular, the present invention discloses a new type of acoustic wave which is nearly polarized in the shear horizontal direction, and which can propagate in thin elastic plates if the ratio $h/\lambda$ k is less than about 3, where h is the plate thickness and $\lambda$ is the acoustic wavelength.

Attractive properties of this quasi-SH wave include: (i) nearly nondispersive propagation, (ii) very large value of $K^2$, the electromechanical coupling coefficient, and (iii) ability to propagate in contact with a liquid medium without suffering excessive attenuation. The nondispersive propagation and large value of $K^2$ makes the wave attractive for use in signal processing and sensing devices. Further, the fact that we wave can propagate in contact with a liquid medium allows the wave to be used in sensors that have to operate in contact with a liquid medium.

Two previous patents have discussed the use of acoustic waves propagating in thin plates. The patent by Martin el al U.S. Pat. No. 5,117,146 is concerned with pure shear horizontal (SH) waves. The limitations of this patent are: (1) SH waves exist in a very limited number of materials, namely isotropic materials, and a very limited number of other materials with very special crystal symmetries, and (2) the coupling coefficient, $K^2$, of these waves is very low. For example, the material used by Martin et al, namely ST-cut quartz can support pure SH waves. But the value of $K^2$ in this material is only 0.0026. In contrast, the quasi-SH wave disclosed here exists in any arbitrary material (the material need not have any special crystalline symmetry) and it also can have very large value of $K^2$. For example, values of $K^2$ as high as 0.15 have been obtained in Z-cut, X-propagating lithium niobate, and still higher values are possible in other materials. Another point to be noted is that in the deuces proposed by Martin, one gets a large number of resonances due to the multiple modes that can propagate in the plate. This makes it difficult for the sensing oscillator to lock onto a particular mode.

Another patent on Lamb waves is that by White et al U.S. Pat. No. 5,129,262. This patent is concerned with the lowest order antisymmetric Lamb wave mode, commonly referred to as the $A_o$ mode. In order to use the $A_o$ mode for sensing in liquids, the velocity of this mode must be less than the velocity of sound in the liquid. This typically requires very small values for the ratio $h/\lambda$ (usually less than 0.05). There is no such restriction for the quasi-SH wave that is disclosed herein. For example, the value of $h/\lambda$ could be quite large, greater than 0.5 or so, and yet the device can operate satisfactorily in a liquid medium.

BRIEF DESCRIPTION OF THE DRAWINGS

The drawings illustrate the best mode presently contemplated of carrying out the invention.

In the drawings.

DESCRIPTION OF THE PREFERRED EMBODIMENT

Figure 1:
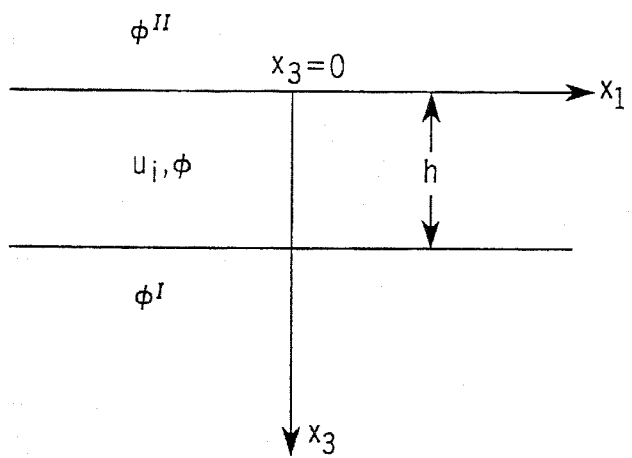
FIG. 1 is a schematic illustration of the geometry of the problem and coordinate system used to analyze the propagation of Lamb waves in a piezoelectric plate.
Figure 2:
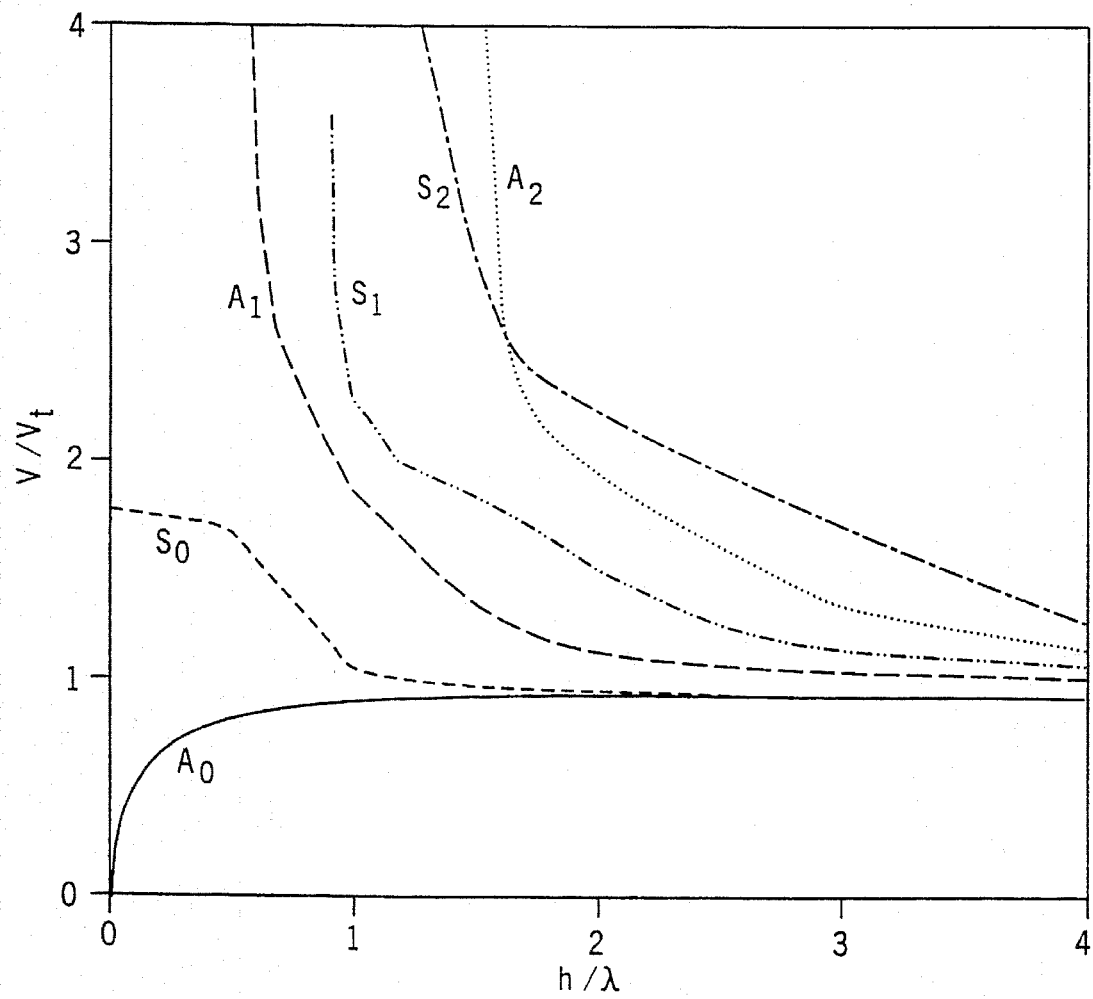
FIG. 2 is a graph of Lamb wave velocity v(normalized to bulk transverse velocity $v_t$) versus $h/\lambda$, where h=plate thickness and $\lambda$=acoustic wavelength for isotropic medium having Poisson's ratio of 0.34.

The present invention is concerned with acoustic waves propagating in plates of finite thickness. The geometry of the problem under consideration is shown in FIG. 1. Waves propagate along the $x_1$ direction of a plate bounded by planes $x_3=0$ and $x_3=h$. The components of particle displacement along the three axes, $x_1$, $x_2$, $x_3$ are denoted by $u_1$, $u_2$, $u_3$, respectively. Acoustic waves propagating in plates of finite thickness are referred to as Lamb waves or plate waves. A given plate can support a number of modes of these waves depending on the value of the ratio $h/\lambda$, where h is the plate thickness and $\lambda$ is the acoustic wavelength. The waves are divided into symmetric and antisymmetric modes to indicate the symmetry, about the median plane of the plate, of the particle displacements associated with the waves. FIG. 2 shows a typical plot of phase velocity versus the ratio $h/\lambda$ for the six lowest Lamb wave modes. The modes are numbered starting from zero, and the symmetry is indicated by the letter S (symmetric) or A (antisymmetric). Thus $A_o$ denotes the lowest order (fundamental) antisymmetric mode, while $A_1$, $A_2$, etc. denote higher order antisymmetric modes. The characteristics of Lamb waves in several materials, isotropic as well as anisotropic, and piezoelectric as well as nonpiezoelectric, have been calculated and are well known. In all cases, the dispersion characteristics were reported to be similar to those shown in FIG. 2.

Recently, while studying the characteristics of Lamb waves propagating in thin plates of lithium niobate, a rather unusual result was discovered. The dispersion characteristic of one of the modes, namely the $A_1$ mode, was found to be different than what was reported previously. This can be seen from FIG. 3 which shows the dispersion characteristics for the six lowest Lamb wave modes in the Z-cut, X-propagating orientation of lithium niobate. Comparison of this figure with FIG. 2 shows that for $h/\lambda>1$, the characteristics are similar to those shown in FIG. 2. But for $h/\lambda<1$, one of the modes (the $A_1$ mode) is found to exhibit an unusual behavior. In this region, the velocity of the $A_1$ mode is found to lie between that of the $A_o$ and $S_o$ modes. Further, the $A_1$ mode is found to extend all the way down to $h/\lambda=0$. According to previous knowledge, it was believed that only two modes, $A_o$ and $S_o$, can propagate in very thin plates ($h/\lambda<<1$), while the higher order modes are cut off. The present analysis, however, indicates that there are three modes, $A_o$, $A_1$ and $S_o$ that can propagate all the way down to $h/\lambda=0$. This is the first time that such behavior has been reported.

Figure 3:
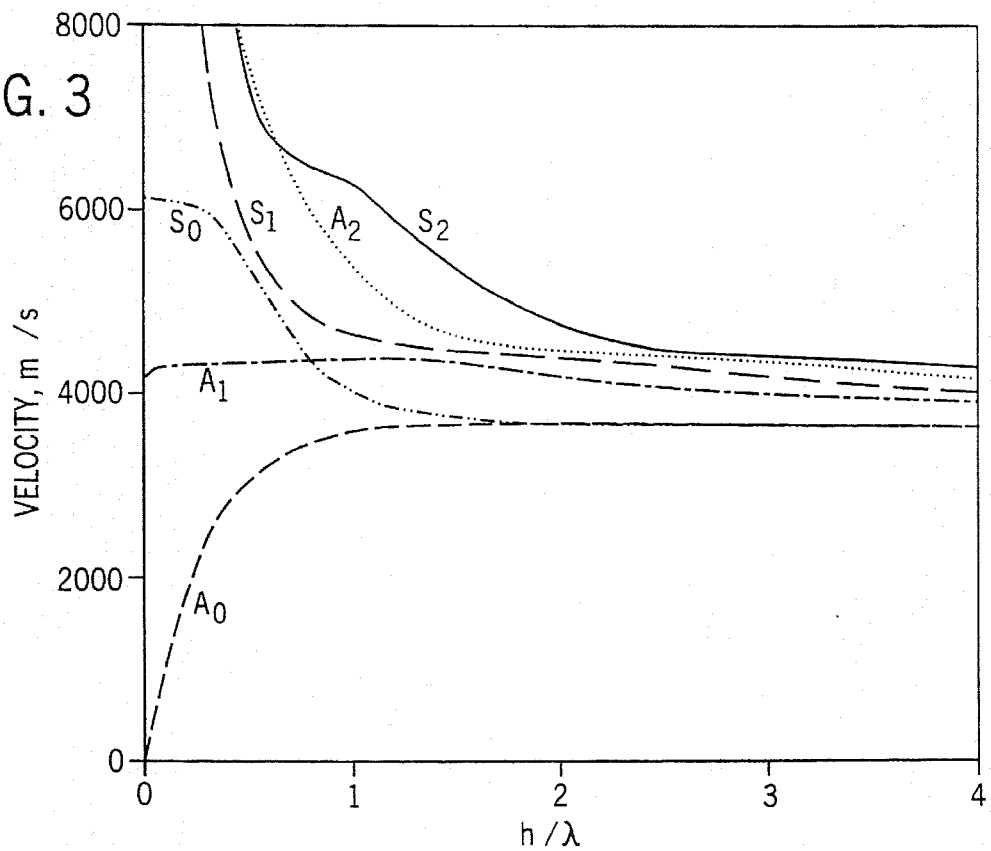
FIG. 3 is a graph of phase velocity v in m/s versus $h/\lambda$ for six lowest Lamb wave modes in Z-cut, X-propagation lithium niobate.

FIG. 3 illustrates that the $A_1$ mode is nearly dispersionless. That is, its velocity remains nearly constant for all values of $h/\lambda$. This behavior looks very similar to that of the lowest order SH (shear horizontal) mode that can propagate in a plate of isotropic material. The SH wave has a single component of particle displacement that lies in the plane of the plate surface and is normal to the direction of wave propagation. That is, $u_1=u_3=0$, $u_2 \neq 0$. However, it can be shown that SH waves can exist only in isotropic materials, and in certain other materials of special crystalline symmetries. The substrate considered here, namely Z-X lithium niobate, cannot support SH waves. That is, in this material, a pure SH wave cannot satisfy the equations of motion and/or the boundary conditions. It should be noted that the $A_1$ mode considered here has all three components of particle displacement and is therefore not a SH wave.

Figure 4:
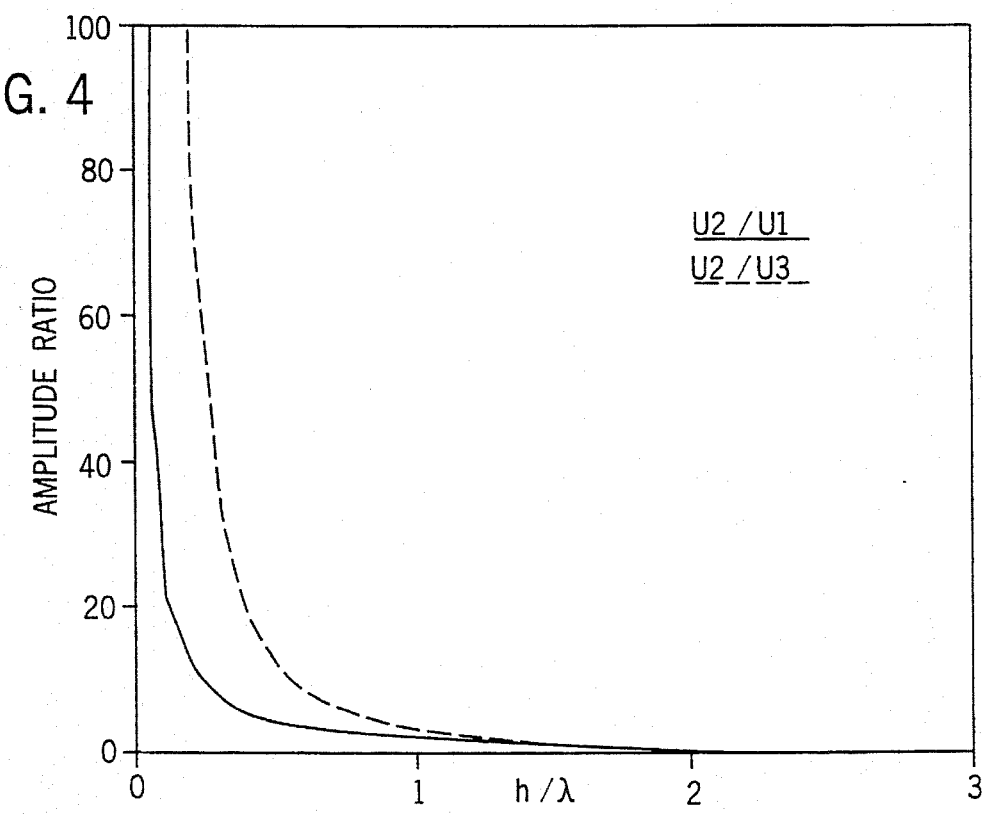
FIG. 4 is a graph illustrating the variation of the ratio $u_2/u_1$ (solid line) and $u_2/u_3$ (dashed line), evaluated at the surface $x_3=0$, as a function of $h/\lambda$ for the $A_1$ mode in Z-cut, X-propagation lithium niobate.

It is interesting to note that while the $A_1$ mode is not a pure SH mode, its particle displacement tends towards that of a SH wave as the ratio $h/\lambda$ tends to zero. We find that as $h/\lambda$ decreases, $u_1$ and $u_3$ decrease, whereas the $u_2$ component of particle displacement increases. This can be seen from FIG. 4 which shows the variation of the ratios $u_2/u_1$ and $u_2/u_3$, evaluated at the surface $x_3=0$, as a function of $h/\lambda$. For small values of $h/\lambda$, the horizontally polarized component of the wave is dominant. For example, at $h/\lambda=0.2$ $u_2/u_1=11$, and $u_2/u_3=73$.

Figure 5:
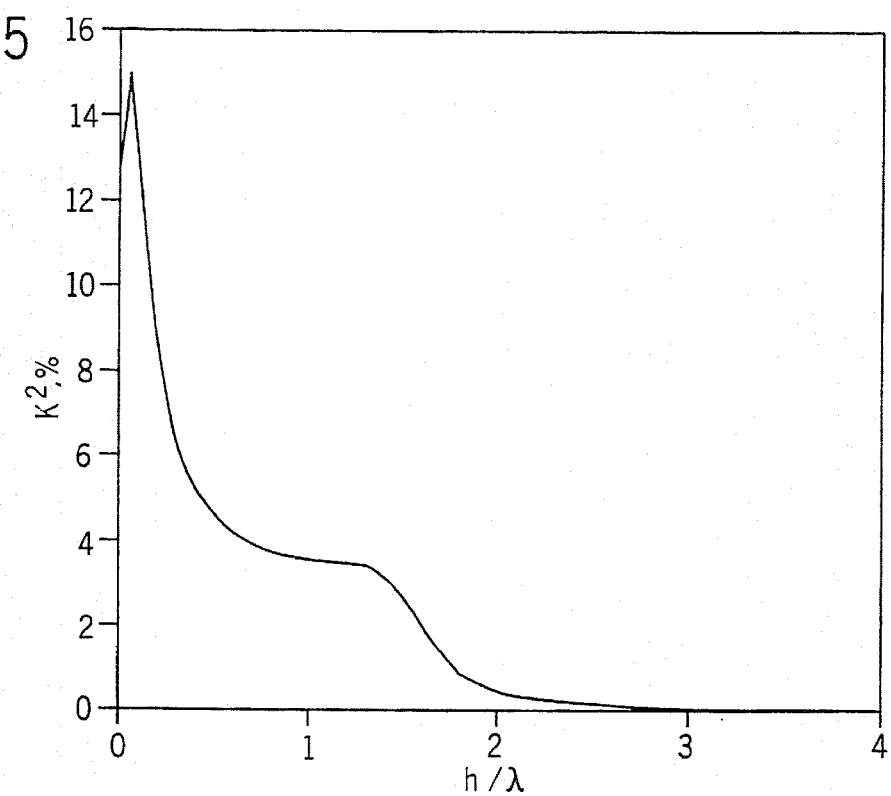
FIG. 5 is a graph illustrating the electromechanical coupling coefficient $K^2$ in percent as a function of $h/\lambda$ for the $A_1$ mode in Z-cut, X-propagation lithium niobate.

The electromechanical coupling coefficient of the $A_1$ mode, $K^2$ can be calculated from the equation $K^2=2(v_o-v_m)/v_o$, where $v_o$ is the wave velocity when the surface $x_3=0$ is electrically open (unmetallized) and $v_m$ the velocity when it is shorted (metallized). Results are shown in FIG. 5. The coupling is negligible for values of $h/\lambda$ greater than 3, but it increases as plate thickness decreases. The coupling coefficient reaches a value as high as 0.15 at $h/\lambda=0.05$. By way of comparison, the value of $K^2$ for surface acoustic waves in a strong piezoelectric material such as Y-Z lithium niobate is 0.048. Thus, an interdigital transducer (IDT) can strongly couple to this mode in acoustically thin plates. Due to its large coupling coefficient, devices based on this wave can operate efficiently over a wide bandwidth.

Experimental Results

Figure 6:
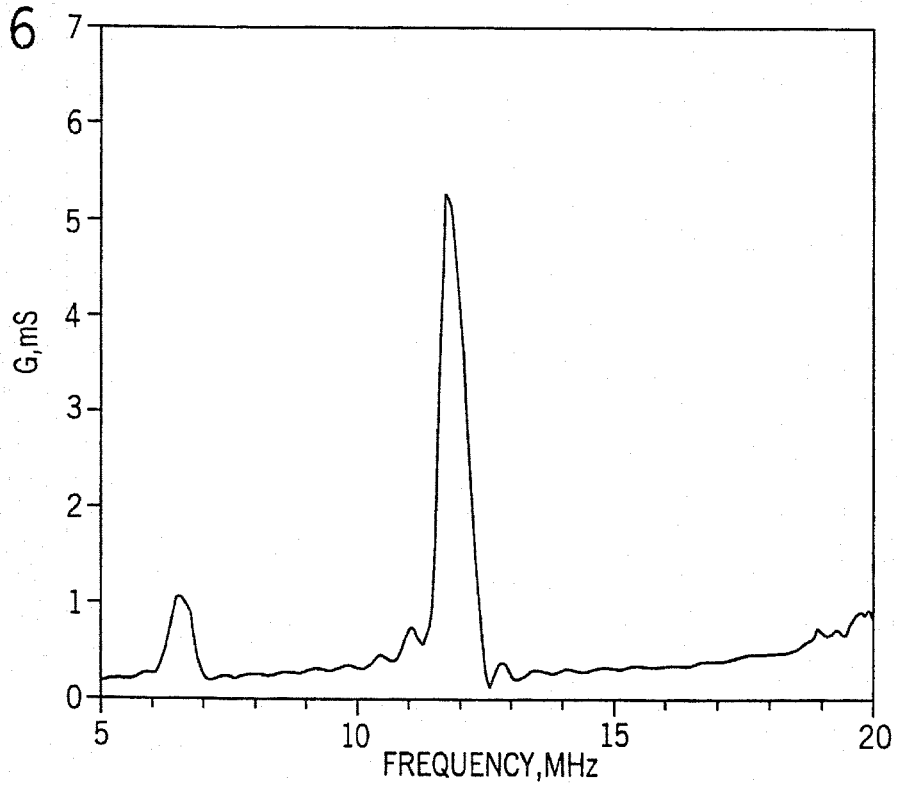
FIG. 6 is a graph illustrating input conductance in mS versus frequency in MHz for an interdigital transducer (IDT) fabricated on a 100 μm thick Z-cut, X-propagation lithium niobate plate. IDT parameters are p=0.346 mm, W=6 mm, and N=20.

The calculations presented above have been verified by measuring the characteristics of Lamb wave devices fabricated on Z-X lithium niobate plates having two different values of the ratio $h/\lambda k$. The experiments utilized IDTs having periodicity p=345 µm, aperture W=6 mm, and number of finger pairs N=20. The devices were fabricated on substrates having initial thickness of 450 µm. Substrate thickness was then reduced by lapping the plates from the back side. The first experiment consisted of measuring the characteristics of IDTs fabricated on thin Z-X lithium niobate plates. Here the plate thickness was reduced to 100 µm, yielding $h/\lambda=100/346=0.289$. The shunt equivalent circuit of the IDT valid at the resonant frequency consists of acoustic radiation conductance $G_a$ in parallel with the electrostatic capacitance $C_T$. In the present case, the transducer shows multiple resonances due to its coupling to various Lamb wave modes. The resonant frequency for a particular mode is given by $f_o=v_p/P$, where $v_p$=phase velocity of the mode, and p is the IDT periodicity. The experimentally observed variation of transducer conductance $G_a$ as a function of frequency is shown in FIG. 6. This figure shows resonances at 6.5 MHz and 11.8 MHz, corresponding to the generation of the $A_o$ and $A_1$ modes, respectively. The experimental values of $G_a$ for these modes are found to be 1.1 mS and 5.3 mS, respectively. These values are in fair agreement with theoretical calculations. It is interesting to note that for the value of $h/\lambda$ used in this experiment, the coupling to the $S_o$ mode is extremely small. This is confirmed by the absence of any peak at 17.45 MHz, the resonant frequency of the $S_o$ mode.

Figure 7:
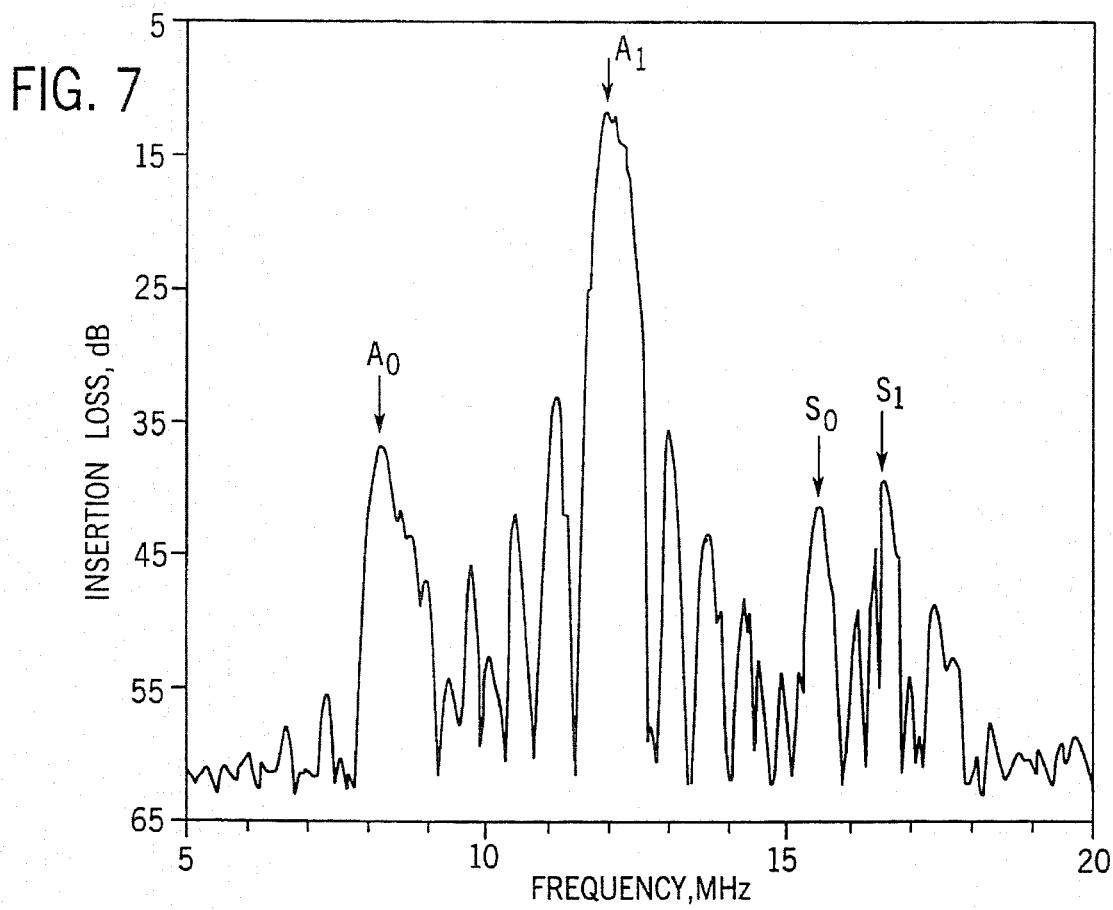
FIG. 7 is a graph illustrating insertion loss in dB versus frequency in MHz for a Lamb wave delay line fabricated on a 0.48 wavelength thick Z-cut, X-propagation lithium niobate plate. The peaks corresponding to the various modes are indicated.

The second experiment consisted of measuring the characteristics of a Lamb wave delay line fabricated on a Z-X lithium niobate plate. The delay line consists of 20 finger pair IDTs having periodicity p=346 µm and aperture W=6 mm. The center to center spacing between the transducers was 12 mm. The plate thickness in this experiment was 167 µm, yielding $h/\lambda=167/346=0.48$. For this value of $h/\lambda$, the $A_1$ mode has v=4379 m/s and $K^2=0.046$. The experimentally measured variation of insertion loss as a function of frequency is shown in FIG. 7. The resonant frequency of the $A_1$ mode is found to be 12.1 MHz, which is slightly lower than the calculated value of 12.66 MHz. The experimental value for the insertion loss is 11 dB, compared to the theoretical value of 8.8 dB. The other resonances observed in FIG. 9 at 8.2, 15.5, and 16.6 MHz correspond to the generation of the $A_o$, $S_o$, and $S_1$ modes, respectively. A useful fact to be noted here is that the resonant frequencies of the adjacent modes ($A_o$ and $S_o$) are sufficiently far away from the resonant frequency of the $A_1$ mode. This is due to the large difference between the velocities of these modes. It can be seen from FIG. 3 that the velocity separation between the modes can be further increased by choosing a lower value of h/λ. It should also be noted that the coupling to modes other than the $A_1$ mode is very weak. FIG. 7 shows that all spurious signals in this device are suppressed by more than 25 dB compared to the signal due to the $A_1$ mode. It should be pointed out here that no attention was paid in the design of this device to reduce the coupling of the IDT to modes other than $A_1$ mode. It is possible that larger suppression of other modes can be achieved by a proper choice of the h/λ ratio.

Figure 8:
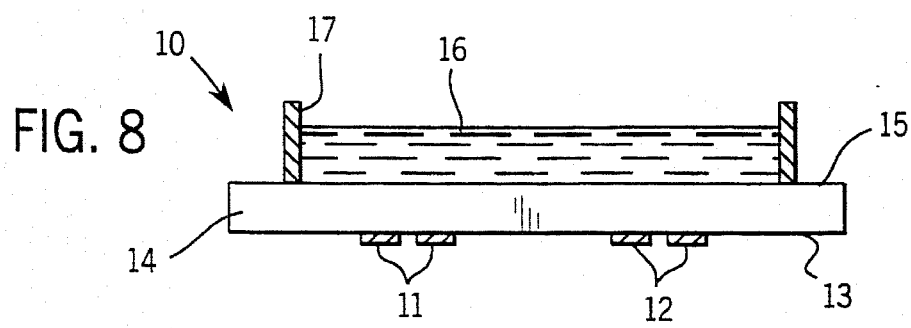
FIG. 8 is a cross-sectional view of an arrangement used to place a liquid in contact with one surface of a Lamb wave delay line.

For small values of h/λ, the polarization (particle displacement) of the $A_1$ mode is nearly SH in nature. Thus the particle displacement normal to the free surface is negligibly small. It is expected therefore that this mode will suffer little attenuation even when a liquid is placed in contact with the propagation surface. To verify this, the delay line was loaded with deionized water using the experimental arrangement shown in FIG. 8. Here the water is in contact with the surface opposite to the one on which the IDTs are located. More particularly, FIG. 8 illustrates a device 10 having a launching transducer 11 and a receiving transducer 12 both coupled to the lower surface 13 of a propagation medium or substrate 14 composed of Z-X lithium niobate. The upper surface 15 of substrate 14 is in contact with water 16 contained within a fluid cell 17. Experimental measurement of insertion loss in the presence of water loading shows that the attenuation of the quasi-SH mode produced by water loading is less than 2 dB. This confirms that a device using this mode can operate satisfactorily while in contact with a liquid medium.

The quasi-SH wave described herein has a high value of $K^2$, the electromechanical coupling coefficient. This wave will therefore by very sensitive to changes in electrical conditions at the plate surfaces. In order to verify this, the test cell shown in FIG. 8 was filled with a dilute aqueous solution of potassium chloride, KCl. The conductivity of the solution, σ, can be varied by varying the concentration of KCl. The conductivity of the solution modifies the phase velocity and attenuation constant of the wave. Analysis shows that the fractional change in velocity, $\Delta v/v_o$ is given by:

$$\frac{\Delta v}{v_o} = -\frac{K^2}{2} \frac{(\epsilon_s + \epsilon_o)}{(\epsilon_s + \epsilon_1)} \frac{\sigma^2}{[\sigma^2 + \omega^2(\epsilon_s + \epsilon_1)^2]} \quad (1)$$

Here $\omega = 2\pi f$ is the angular frequency of the wave, and $\epsilon_o$, $\epsilon_s$, and $\epsilon_1$ are the permittivities of free space, substrate, and liquid, respectively. The velocity shift can be conveniently measured by connecting the delay line in the feedback patch of a suitable amplifier resulting in a delay line stabilized oscillator. A change in wave velocity results in a change in the oscillator frequency according to the relation $$\frac{\Delta f}{f_o} = \frac{\Delta v}{v_o}$$

Figure 9:
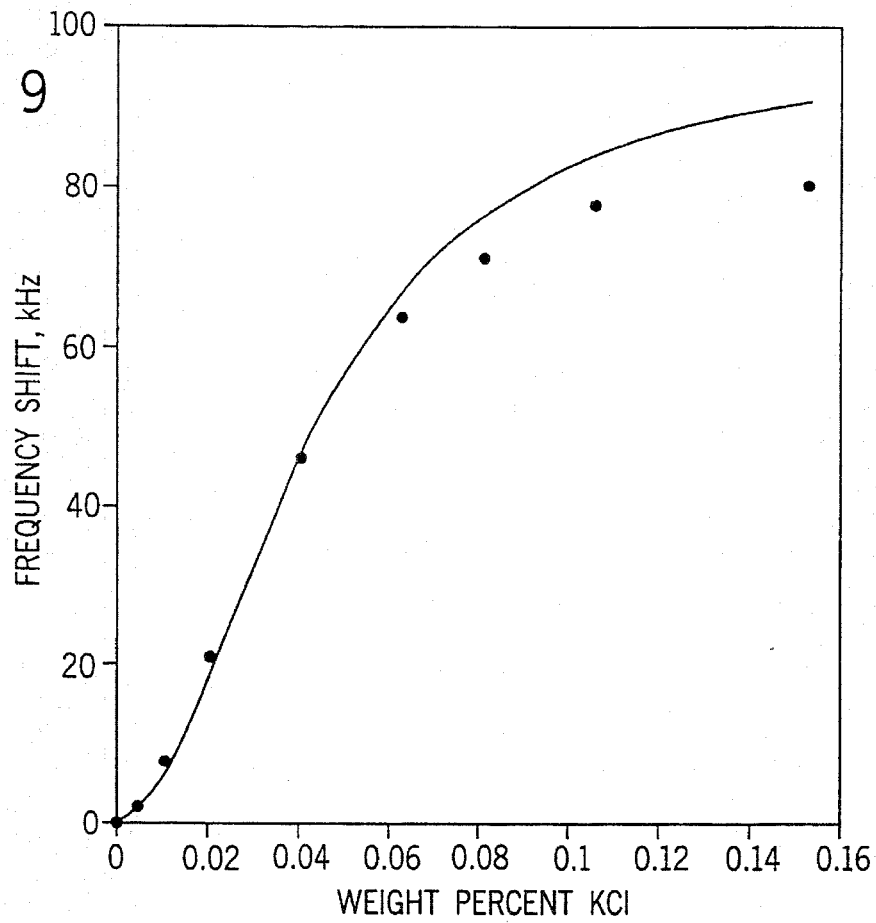
FIG. 9 is a graph illustrating the change in oscillator frequency in kHz versus concentration of potassium chloride solution in percent for a 12 MHz quasi-SH mode oscillator fabricated on a 0.48 wavelength thick Z-X lithium niobate plate. Solid line shows the theoretically calculated frequency shift while the experimental data is indicated by the dotted line.

Experimental results for change in oscillator frequency as a function of KCl concentration are shown in FIG. 9. The delay line whose characteristics are shown in FIG. 7 was used in this experiment. The theoretical curve shown in FIG. 9 was generated from Eq. (1) using the following values: $\epsilon_s = 43.9\epsilon_o$, $\epsilon_1 = 79.4 \epsilon_o$, and $K^2 = 0.046$. FIG. 9 shows that measured values are in fair agreement with theoretical calculations. It should also be noted that there is a large change in oscillator frequency, more than 80 kHz, for variation in KCl concentration from 0 to 0.15%. This is due to the large $K^2$ of the quasi-SH wave. It should be pointed out here that a ST-cut quartz plate with wave propagation at right angle to the X-axis can support a pure SH wave. This wave has been used previously for liquid-phase sensing applications, as is well known. However, the coupling coefficient in quartz is very low (only about 0.0026). Thus, if the same experiment had been performed with a 12 MHz SH mode quartz delay line, the change in oscillator frequency would have been less than 0.6 kHz.

An important question that needs to be addressed is whether the quasi-SH wave described above is unique to the particular material that was considered here (Z-X lithium niobate), or whether it will also exist in other materials. The answer to this question is in the affirmative. That is, it can be shown that the quasi-SH wave will occur in thin plate of any arbitrary material. It is well known that elastic materials, depending on their crystalline symmetry, can be divided into a total of 32 different crystal symmetry classes. The quasi-SH wave will exist in materials belonging to any and all of the above crystal classes. The only exceptions to this statement are certain special cases, such as isotropic material, for example, in which the quasi-SH wave will degenerate into a pure SH wave. However, the pure SH wave can be considered as a limiting or special case of the general quasi-SH wave that we have discussed above. With this provision in mind, it can be stated that the quasi-SH wave will exist in all elastic materials, irrespective of their crystal symmetry and their piezoelectric properties. Thus one has a wide choice of materials for use in quasi-SH wave devices.

Figure 10:
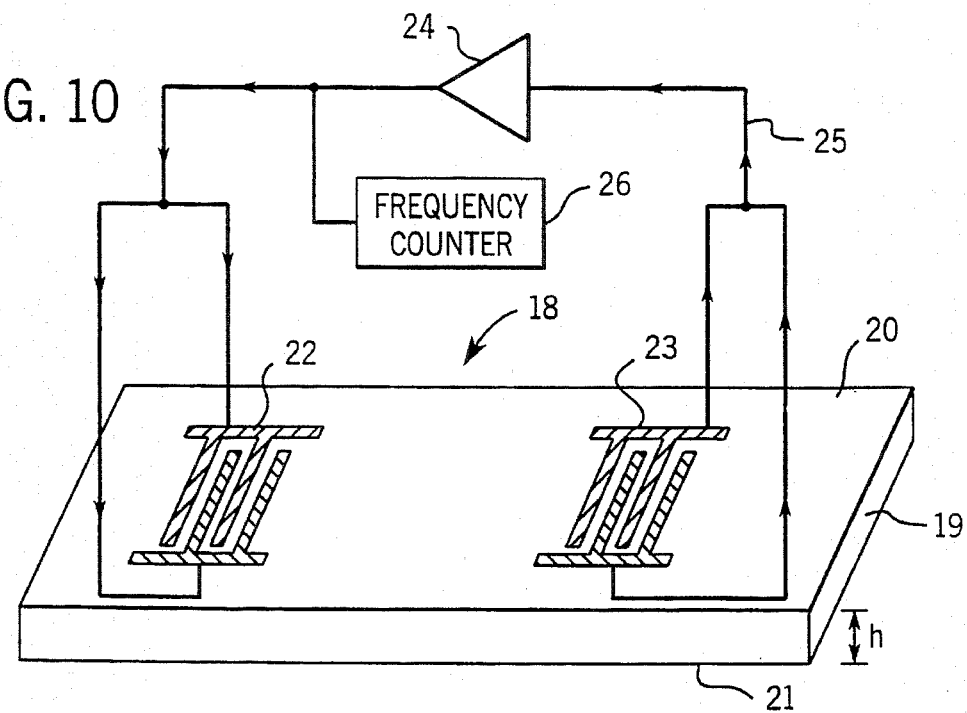
FIG. 10 is a perspective view of a quasi-SH acoustic wave sensor showing transducers arranged on the same surface of the device.

Referring now to FIG. 10, there is illustrated a typical solid state acoustic sensor 18 having a generally rectangular shaped piezoelectric substrate 19 having a thickness h. Substrate 19 has parallel planar upper and lower surfaces 20 and 21 with an interdigital launching transducer 22 and a spaced interdigital receiving transducer 23 coupled to the surface 20 at opposite ends of substrate 19. Each transducer 22 and 23 is formed of interdigitated elongated sets or combs of fingers arranged perpendicular to the path of the propagating acoustic wave, i.e., the transducers are disposed normal to the direction of propagation of the acoustic wave.

The transducers 22 and 23 thus define an acoustic sensor useful for sensing changes in parameters such as temperature, pressure, density, flow rate and the like. This is accomplished by measuring the fractional change in a propagation characteristic of the acoustic wave such as the velocity of the quasi-SH wave resulting from changes in the parameter being sensed. One technique for measuring these fractional velocity changes involves driving the transducer 22 with a radio frequency signal source such as amplifier 24. Amplifier 24 is connected in a feedback path 25 between launching transducer 22 and receiving transducer 23. A frequency counter 26 is connected to the output of amplifier 24 which provides a measure of the perturbations in wave velocity.

The substrate 19 is preferably composed of Z-cut, X-propagating lithium niobate. However, as noted above, any elastic material typically employed in solid-state acoustic wave devices may be employed, except isotropic materials, irrespective of their crystal symmetry or piezoelectric properties. Further examples of appropriate substrates include Y-cut, X-propagating lithium niobate, ST-cut quartz, and 128° rotated Y-cut, X-propagating lithium niobate.

Figure 11:
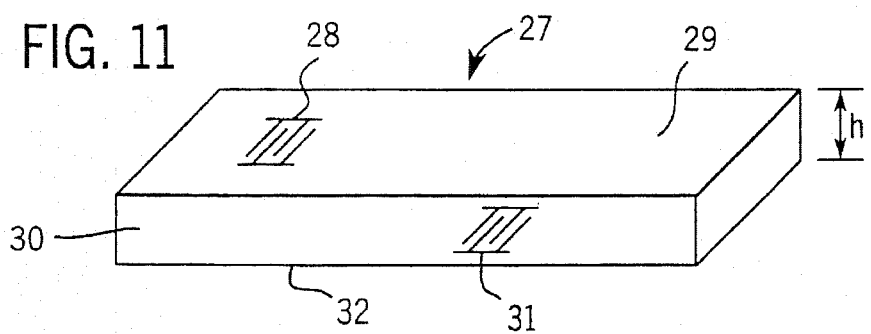
FIG. 11 is a perspective view of a quasi-SH acoustic wave sensor showing transducers arranged on opposite sides of the device.

An alternative design for a sensor 27 is shown in FIG. 11. In this embodiment, launching transducer 28 is coupled to one surface 29 of substrate 30 while receiving transducer 31 is coupled to the opposite surface 32 of substrate 30.

Figure 12:
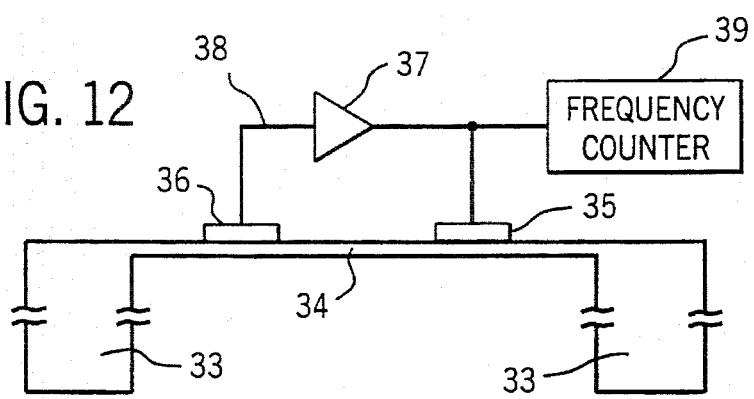
FIG. 12 is a schematic cross-sectional view of a quasi-SH acoustic wave sensor using a thin membrane structure.

Yet another design is shown in FIG. 12 where sensor 33 includes legs 33 that support opposite ends of a thin membrane 34. A launching transducer 35 and a receiving transducer 36 are located on the membrane 34 at spaced apart locations. Measurements are again typically taken via a feedback amplifier 37 suitable for operation at radio frequencies connected in a feedback path 38 between transducers 35 and 36, and a frequency counter 39 connected to the output of the amplifier 37.

Figure 13:
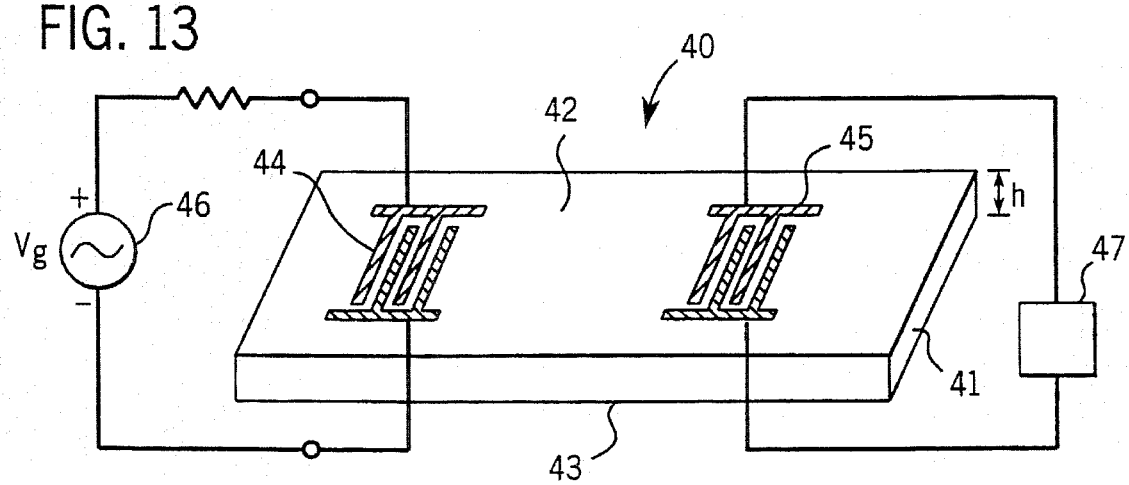
FIG. 13 is a perspective view of a quasi-SH acoustic wave delay line.

Referring now to FIG. 13, there is illustrated a typical solid state acoustic delay line 40 having a generally rectangular shaped piezoelectric substrate 41 having a thickness h. Substrate 41 has parallel planar upper and lower surfaces 42 and 43 with an interdigital launching transducer 44 and a spaced interdigital receiving transducer 45 coupled to the surface 42 at opposite ends of substrate 41. Each transducer 44 and 45 is formed of interdigitated elongated sets or combs of fingers arranged perpendicular to the path of the propagating acoustic wave, i.e., the transducers are disposed normal to the direction of propagation of the acoustic wave.

The transducers 44 and 45 thus define an acoustic delay line useful as a filter, a convolver and the like. This is accomplished by measuring the time delay of the acoustic wave as measured between launching transducer 44 and receiving transducer 45. One technique for measuring this time delay involves driving the transducer 44 with a radio frequency signal source such as generator 46. A receiver 47, such as an r.f. voltmeter or an oscilloscope detects the acoustic wave generated by transducer 44 by being connected to the transducer 45 which provides a measure of the time delay.

In summary, it has been shown that a new type of acoustic wave which is nearly polarized in the shear horizontal direction, can propagate in thin elastic plates if the ratio $h/\lambda$ is less than about 3. Attractive properties of this quasi-SH wave include: (i) nearly nondispersive propagation, (ii) very large value of $K^2$, the electromechanical coupling coefficient, and (iii) ability to propagate in contact with a liquid medium without suffering excessive attenuation. The nondispersive propagation and large value of $K^2$ makes the wave attractive for use in signal processing and sensing devices. Further, the fact that the wave can propagate in contact with a liquid medium allows the wave to be used in sensors that have to operate in contact with a liquid medium.

Various modes of carrying out the invention are contemplated as being within the scope of the following claims particularly pointing out and distinctly claiming the subject matter regarded as the invention.

We claim:

1. A solid-state acoustic wave sensor device, comprising:

(a) an anisotropic elastic substrate having a pair of opposed surfaces, said substrate having a thickness h which lies between 0 and $3\lambda$, where $\lambda$ is the wavelength of the quasi-shear horizontal acoustic wave to be propagated through the substrate;

(b) input transducer means affixed to said substrate for propagating quasi-shear horizontal acoustic waves through said substrate;

(c) output transducer means affixed to said substrate for receiving quasi-shear horizontal acoustic waves propagated through said substrate from said input transducer means;

(d) means for applying an input r.f. signal to said input transducer to generate said quasi-shear horizontal wave;

(e) means for receiving an output r.f. signal from said output transducer representative of a propagation characteristic of said quasi-shear horizontal acoustic wave; and (f) measuring means for measuring a selected propagation characteristic of said output signal from said output transducer.

2. The device of claim 1 wherein the selected propagation characteristic of said quasi-shear wave is perturbations in the velocity of said wave.

3. The device of claim 1 wherein said input transducer means comprises an interdigital comb coplanar with one surface of said substrate.

4. The device of claim 1 wherein said output transducer means comprises an interdigital comb coplanar with one surface of said substrate.

5. The device of claim 1 wherein said input and output transducer means each comprise a pair of interdigital combs coplanar with one surface of said substrate.

6. The device of claim 1 wherein said input and output transducer means each comprise a pair of interdigital combs coplanar with opposite surfaces of said substrate.

7. The device of claim 1 wherein said substrate is composed of a piezoelectric substance.

8. The device of claim 7 wherein said piezoelectric substance is quartz.

9. The device of claim 1 further including means for maintaining a liquid in contact with a portion of one of the surfaces of said substrate, said liquid creating perturbations in the velocity of said quasi-SH wave propagating in the substrate.

10. The device of claim 9 wherein said means for maintaining a liquid comprises a liquid receiving cell having a liquid containing wall extending from said one substrate surface.

11. The device of claim 1 wherein said substrate comprises a thin membrane having opposite ends, and further including support means for supporting said substrate at said opposite ends.

12. The device of claim 1 wherein said substrate is composed of Z-cut, X-propagating lithium niobate.

13. The device of claim 1 wherein said substrate is composed of Y-cut, X-propagating lithium niobate.

14. The device of claim 1 wherein said substrate is composed of 128° rotated Y-cut, X-propagating lithium niobate.

15. A solid-state acoustic wave device, comprising:

(a) an anisotropic elastic substrate having a pair of opposed surfaces, said substrate having a thickness h which lies between 0 and $3\lambda$, where $\lambda$ is the wavelength of the quasi-shear horizontal acoustic wave to be propagated through the substrate;

(b) input transducer means affixed to said substrate for propagating quasi-shear horizontal acoustic waves through said substrate;

(c) output transducer means affixed to said substrate for receiving quasi-shear horizontal acoustic waves propagated through said substrate from said input transducer means;

(d) means for applying an input r.f. signal to said input transducer to generate said quasi-shear horizontal wave; and (e) means for receiving an output r.f. signal from said output transducer.

16. The device of claim 15 wherein said input transducer means comprises an interdigital comb coplanar with one surface of said substrate.

17. The device of claim 15 wherein said output transducer means comprises an interdigital comb coplanar with one surface of said substrate.

18. The device of claim 15 wherein said input and output transducer means each comprise a pair of interdigital combs coplanar with one surface of said substrate.

19. The device of claim 15 wherein said input and output transducer means each comprise a pair of interdigital combs coplanar with opposite surfaces of said substrate.

20. The device of claim 15 wherein said substrate is composed of a piezoelectric substance.

21. The device of claim 15 further including means for maintaining a liquid in contact with a portion of one of the surfaces of said substrate, said liquid causing attenuation of undesired waves propagating in the substrate.

22. The device of claim 15 wherein said substrate comprises a thin membrane having opposite ends, and further including support means for supporting said substrate at said opposite ends.

23. The device of claim 15 wherein said substrate is composed of Z-cut, X-propagating lithium niobate.

24. The device of claim 15 wherein said substrate is composed of Y-cut, X-propagating lithium niobate.

25. The device of claim 15 wherein said substrate is composed of 128° rotated Y-cut, X-propagating lithium niobate.

* * * * *